United States Patent [19]

Asaba et al.

[11] Patent Number: 5,776,255
[45] Date of Patent: Jul. 7, 1998

[54] CHEMICAL VAPOR DEPOSITION APPARATUS

[75] Inventors: Tetsuo Asaba, Odawara; Yasushi Kawasumi, Fujisawa; Kazuaki Ohmi; Yasuhiro Sekine, both of Yokohama; Yukihiro Hayakawa, Atsugi, all of Japan

[73] Assignee: Canon Kabushiki Kaisha, Tokyo, Japan

[21] Appl. No.: 675,843

[22] Filed: Jul. 5, 1996

Related U.S. Application Data

[63] Continuation of Ser. No. 171,431, Dec. 22, 1993.

[30] Foreign Application Priority Data

Dec. 24, 1992 [JP] Japan .................. 4-357271

[51] Int. Cl.$^6$ ........................... C23C 16/00
[52] U.S. Cl. ............... 118/726; 261/124; 261/DIG. 65
[58] Field of Search ............... 118/715, 726; 261/DIG. 65, 124; 392/400, 401, 402

[56] References Cited

U.S. PATENT DOCUMENTS

| | | | |
|---|---|---|---|
| 3,901,182 | 8/1975 | Chiang | 118/49 |
| 4,261,933 | 4/1981 | Ewing | 261/124 |
| 4,278,458 | 7/1981 | O'Connor et al. | 65/2 |
| 4,478,766 | 10/1984 | Horikita | 261/124 |
| 4,861,524 | 8/1989 | Sielaff | 261/124 |
| 5,078,922 | 1/1992 | Collins | 261/124 |
| 5,134,092 | 7/1992 | Matsumoto et al. | 437/192 |

FOREIGN PATENT DOCUMENTS

| | | | |
|---|---|---|---|
| 058571 | 8/1982 | European Pat. Off. | 261/DIG. 65 |
| A0139134 | 5/1985 | European Pat. Off. | C30B 25/14 |
| A0283874 | 9/1988 | European Pat. Off. | C23C 16/44 |
| A0390127 | 10/1990 | European Pat. Off. | C30B 25/02 |
| A0419939 | 4/1991 | European Pat. Off. | C23C 16/44 |
| A0420596 | 4/1991 | European Pat. Off. | C23C 16/44 |
| 0425084 | 5/1991 | European Pat. Off. | |
| A0448223 | 9/1991 | European Pat. Off. | H01L 21/285 |
| A0459773 | 12/1991 | European Pat. Off. | H01L 23/528 |
| A0476713 | 3/1992 | European Pat. Off. | C30B 25/18 |
| A0503382 | 9/1992 | European Pat. Off. | C23C 16/40 |
| 0696472A1 | 2/1996 | European Pat. Off. | |
| 60-248228 | 12/1985 | Japan | |
| 63-107016 | 5/1988 | Japan | H01L 21/205 |
| 026558 | 8/1991 | Japan | C23C 16/20 |

OTHER PUBLICATIONS

Powell, Vapor Deposition, John Wiley & Sons, NY, ©1966, pp. 269–276.

Database WPO, Section ch, week 8439, An 84–24 1215 Aug. 1984 (abstract).

Wartik et al., "Reactions of Lithium Aluminum Hydride with Representative Elements of the Main Groups of the Periodic System," JACS, 75:835 (1953).

Yonehara et al., "Manipulation of Nucleation Sites and Periods Over Amorphous Substrates," App. Phys. Lett., 52:1231 (1988).

Primary Examiner—Richard Bueker
Attorney, Agent, or Firm—Fitzpatrick, Cella, Harper & Scinto

[57] ABSTRACT

A chemical vapor deposition apparatus comprises a starting material container holding a starting material in a liquid state, a starting gas generating container into which the liquid starting material is fed from the starting material container, a means for keeping constant the liquid level of the liquid starting material held in the starting gas generating container, a means for injecting a bubbling gas from the outside into the liquid starting material held in the starting gas generating container, thereby bubbling the starting gas, and a reaction chamber into which a mixed gas of the starting gas and the bubbling gas are fed.

7 Claims, 8 Drawing Sheets

CHEMICAL VAPOR DEPOSITION APPARATUS

This application is a continuation, of application Ser. No. 08/171,431 filed Dec. 22, 1993, now abandoned.

BACKGROUND OF THE INVENTION

1. Field of the Invention

This invention relates to an apparatus for vaporizing a liquid which becomes a starting gas (hereinafter referred to as "starting gas liquid"), and more particularly to a chemical vapor deposition apparatus capable of vaporizing a high-boiling starting gas liquid of organic metal compounds or the like in a under controlled conditions in chemical vapor deposition (hereinafter referred to as "CVD") as used for example when, fabricating semiconductor devices.

This invention also relates to a method for fabricating a semiconductor device by using the chemical vapor deposition apparatus, and more particularly to a method for fabricating a semiconductor device by causing a monocrystal to selectively grow on a non-monocrystalline surface and forming an Al electrode on the monocrystal.

2. Related Background Art

The Prior art:

Sputtering has been hitherto used to form metal wiring in semiconductor devices. However, sputtering, by which atoms sputtered from a target material are deposited on a substrate, has a poor terraced-portion covering performance. It also is not feasible for selective growth.

FIGS. 5A and 5B are diagrammatic cross sections, the former showing an instance in which Al wiring is deposited in a contact hole having a small aspect ratio, and the latter showing an instance in which Al wiring is similarly provided in a contact hole having a large aspect ratio, according to conventional sputtering. In FIGS. 5A and 5B, reference numeral 201 denotes a silicon substrate; 202, an insulating film formed of silicon dioxide or the like; and 203, a wiring material of aluminum or the like. As shown in FIG. 5B, in the contact hole having a large aspect ratio, there is a great possibility of the occurrence of a locally thin Al wiring layer or a void to cause disconnection.

Meanwhile, FIG. 6 is a diagrammatic cross section in which an Al wiring layer is formed in a contact hole having a large aspect ratio by CVD. In FIG. 6, reference numeral 301 denotes a silicon substrate; 302, an insulating film formed of silicon dioxide or the like; and 303, a metallic material such as aluminum deposited by CVD; 304, aluminum wiring deposited by sputtering or CVD.

As shown in FIG. 6, in the selective deposition carried out by CVD, the contact hole is completely filled up with aluminum, so that the possibility of disconnection becomes very low.

Thus, since the formation of Al thin films by CVD can achieve a superior terraced-portion covering performance and besides enables selective deposition on a conductive material, it is also possible to selectively deposit Al in contact holes and thereafter carry out non-selective deposition to provide a completely flat surface without causing disconnection in contact holes.

As stated above, CVD is advantageous as a process for fabricating semiconductor devices with fine wiring. In CVD, however, starting materials must be converted into gases so that they can be fed a reaction space. Accordingly, in order to carry out the selective deposition using as a starting material the organic metal materials that are liquid at room temperature and normal pressure, apparatus have been hitherto constituted as follows:

A basic constitution of the apparatus is shown in FIG. 7. In FIG. 7, a carrier gas such as hydrogen is brought under reduced pressure by means of a reducing valve 401 and sent to a bomb 402 provided with a bubbling mechanism. Most of starting gases feasible for selective deposition of aluminum are in a liquid state at room temperature, as exemplified by dimethylaluminum hydride (hereinafter "DMAH") and triisobutylaluminum (hereinafter "TIBA"). Hence, the bubbling is effected to make bubbles in the bomb, so that a mixed gas comprised of the carrier gas and a saturated vapor of organic aluminum compound such as DMAH or the like is pressure-forwarded at the outlet of the bomb.

This mixed gas is fed into a reaction chamber 403 to cause thermal decomposition reaction on a heated semiconductor substrate, and aluminum is deposited thereon.

The reaction chamber 403 is exhausted by means of a vacuum pump 404. Reference numeral 405 denotes an auxiliary pump.

In an instance in which DMAH is used as the organic aluminum compound gas and hydrogen as the carrier gas, the following reaction proceeds on the surface of the semiconductor substrate.

$$2AlH(CH_3)_2 + H_2 \rightarrow 2Al + 4CH_4 \quad (1)$$

or

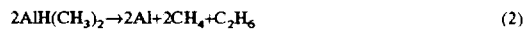
$$2AlH(CH_3)_2 \rightarrow 2Al + 2CH_4 + C_2H_6 \quad (2)$$

What is questioned in the foregoing is that, although the deposition selectivity between a conductive material and a non-conductive material can be completely assured if the reduction reaction attributable to hydrogen as shown in formula (1) proceeds, no deposition selectivity between a conductive material and a non-conductive material can be completely assured if simple thermal decomposition as shown in formula (2) proceeds, so that it becomes impossible to fill up the hole with aluminum as shown in FIG. 6.

Hence, it follows that a molar ratio of DMAH to hydrogen in the mixed gas has a great influence on the state of deposition.

In the foregoing gas feeding method, the quantity of the starting gas fed into the reaction chamber can be approximately represented as follows:

$$Q = Q_{in} \times (P_v/P_B) \quad (3)$$

In formula (3), Q is a quantity of the starting material being fed, $Q_{in}$ is a quantity of the gas fed in from an inlet pipe. $P_V$ is a saturated vapor pressure of a starting gas, and $P_B$ is a pressure inside a reactor.

As be seen from formula (3), when a starting material with a small saturated vapor pressure is used, the starting material being fed becomes smaller in quantity, so the deposition rate is determined by the feed rate of the starting material. In such a state in which the former is determined by the latter, the following problems may occur.

(1) Deposition rate differ depending on the diameter of contact holes.

(2) The hole is filled up with aluminum in a shape having facets (as shown in FIGS. 5A and 5B) and can not be filled up in a flat shape.

Accordingly, in CVD carried out using a liquid starting material, a system capable of stably feeding a large quantity of starting materials in a proper mixing ratio is considered a most important requirement.

In recent years, as semiconductor integrated circuits are made more highly integrated, a technique by which a fine structure at a submicron level is formed on a semiconductor wafer in a good controllability has attracted notice. In particular, in the process of fabricating ICs, LSIs and so forth, an uneven structure formed on the surface of a semiconductor wafer subjected to patterning is necessarily fine and dense. Hence, in the step of forming wirings between elements, it becomes necessary to use a technique by which a conductor film serving as a wiring material can be formed on the fine and dense uneven surface in a good covering performance and at the same time fine wiring connecting openings (hereinafter referred to as "contact holes") of 1 µm or less in diameter can be filled up with the wiring material.

In the formation of wirings between elements in ICs or LSIs, Al or Al alloy film formed by sputtering has also been used. However, sputtering, in which atoms broken away from a target material by sputtering the material are deposited on the wafer surface, is known to give differences in the shape of covering in accordance with unevenness of the wafer surface. Especially when contact holes are 1 µm or less in diameter and 1 µm or more in depth, it is difficult to completely fill up the contact hole by sputtering.

Meanwhile, according to the CVD film forming technique, the starting gas contained in a gas phase coming into contact with the wafer surface is decomposed by heat energy or the like to thereby form a desired film on the wafer surface. CVD makes it possible to uniformly distribute a deposited film material over the wafer surface, and also makes it possible to form films with a superior terraced-portion covering performance compared with sputtering, because of the film deposition that takes place as a result of decomposition reaction of the starting material gas on the wafer surface. CVD also makes it possible to selectively form a film only on a specific material by utilizing differences in the mechanism of decomposition reaction of starting material gases on the surfaces of various materials such as Si, metals and insulating films laid bare to the wafer surface. Hence, suitable selection of starting material gas species and conditions enables selective formation of conductor films only inside the contact holes.

Accordingly, a number of studies have been made on the formation of wiring material films by CVD, and it has been already ascertained that Al, W, Cu and so forth can be formed into films by CVD.

However, most starting gases for wiring material films are liquid at room temperature and also commonly have a small vapor pressure. For example, DMAH used as a starting material gas for Al films has a saturated vapor pressure of about 2 Torr at room temperature, and TIBA about 0.5 Torr. Thus, in order to supply a starting gas liquid having a small saturated vapor pressure into the reaction chamber of a CVD apparatus, it is necessary to provide a vaporizer.

As the vaporizer for a starting gas liquid, a bubbling apparatus has been hitherto used. A conventional bubbling apparatus is schematically illustrated in FIG. 10. In the bubbling apparatus, a carrier gas 554 is blown from an inlet pipe 553 into a starting gas liquid 552 put in a starting gas liquid container 551, and vapor of the starting gas liquid 552 is taken into bubbles 555 of the carrier gas so that a carrier gas 557 having therein the vapor of the starting gas liquid is fed from an outlet pipe 556.

Three-dimensional integrated circuits in which semiconductor devices are multi-layered in the direction normal to a substrate to provide a more highly integrated and multi-functional circuit have been developed in recent years.

Development is also energetically being made on large-area semiconductor devices for solar cells comprising elements arranged in an array on an inexpensive glass plate, switching transistors of liquid crystal picture elements, and so forth.

What is common to the both is that they require a technique by which a semiconductor thin film is formed on an amorphous insulating substrate and electronic devices such as transistors are formed on the semiconductor thin film. In particular, what is important is a technique by which a high-quality monocrystalline semiconductor layer is formed on the amorphous insulating substrate.

As the technique by which a high-quality monocrystalline semiconductor layer is formed on the amorphous insulating substrate, a crystal growth process called SENTAXY (Selective Nucleation Based Epitaxy) is proposed (Japanese Patent Application Laid-open No. 63-107016, and Applied Physics Letters, Vol. 52, page 1231, 1988).

SENTAXY is a crystal growth process in which crystal growth treatment is applied to a substrate having a free surface adjoiningly provided with i) a non-nucleation surface having a smaller nucleation density and ii) an amorphous or polycrystalline nucleation surface having a sufficiently small area so as to form only a single nucleus from which a monocrystal is grown and having a larger nucleation density than that of the non-nucleation surface, thereby causing a monocrystal to grow from the single nucleus. When the monocrystal to be grown is constituted of a semiconductor material such as Si or GaAs, a semiconductor device can be made. When a plurality of nucleation surfaces are arranged on the substrate, a semiconductor device array can be fabricated.

Electrodes required when semiconductor devices are fabricated are usually formed by photolithography. Employment of the above crystal growth process is accompanied by formation of the facets that are peculiar to monocrystals when monocrystals are made to grow on the amorphous substrate, so that the substrate has a surface irregularity and no patterning can be carried out unless countermeasure are taken. The monocrystals on the surface are made smooth by polishing and thereafter a resist is coated to carry out patterning of electrodes by photolithography. Here, EB vacuum deposition or sputtering is used to form films of electrode materials such as Al.

Problems A & B:

The prior art apparatuses described above, are disadvantageous in the following points. Disadvantage (1):

As stated previously, even though the mixing ratio of an organic metal compound to hydrogen is an important factor, they have a very poor controllability on the mixing ratio. Disadvantage (2):

The mixing ratio of an organic metal compound to hydrogen may change depending on temperature changes in the vicinity of the bomb. Disadvantage (3):

The mixing ratio of an organic metal compound to hydrogen may differ depending on the quantity of the liquid remaining in the bomb.

The above three disadvantages can be further detailed as follows: taking account of the instance in which the organic metal compound is DMAH, the molar mixing ratio depends on DMAH saturated vapor pressure and hydrogen partial pressure at the outlet of the bomb.

$$n_{DMAH}/n_{H2} = P_{DMAH}/P_{H2} \quad (4)$$

wherein $n_{DMAH}$ is a molar number of DMAH gas fed into the reaction chamber;

$n_{H2}$ is a molar number of $H_2$ fed into the reaction chamber;

$P_{DMAH}$ is a partial pressure (saturated vapor pressure) of DMAH gas at the bomb outlet; and $P_{H2}$ is a partial pressure of $H_2$ at the bomb outlet.

In the above, $P_{DMAH}$ unconditionally depends on temperature, and is 1 to 2 Torr at best at room temperature. $P_{H2}$ can be controlled using the reducing valve 401 as previously described with reference to FIG. 7, but substantially depends on the precision of the reducing valve 401. When the ratio of $P_{DMAH}$ to $P_{H2}$ should be controlled to be several times, $P_{H2}$ comes to be about 10 Torr, and the reducing valve must be controlled to provide a pressure of several Torr units. However, it is very difficult to achieve this condition by reducing valve techniques of the prior art.

With regard to disadvantage (2), how the molar mixing ratio may change depending on temperature changes will be shown below.

As in formula (4), the molar mixing ratio changes depending on $P_{DMAH}$. Since the $P_{DMAH}$ is merely a saturated vapor pressure, it may change depending on temperatures. Table 1 shows saturated vapor pressure of DMAH (see J. Am. Chem. Soc., Vol. 75, Feb. 20, pp. 835–839, 1953)

TABLE 1

| Saturated vapor pressure of DMAH | | | | | | | | |
|---|---|---|---|---|---|---|---|---|
| Temperature (°C.): | 24.7 | 25.9 | 35.8 | 39.4 | 47.5 | 49.1 | 54.6 | 57.1 |
| Vapor pressure (mmHg): (Found) | 1.8 | 2.1 | 3.6 | 4.7 | 7.7 | 8.4 | 11.7 | 13.2 |
| Temperature (°C.): | 61.8 | 66.5 | 69.2 | 72.0 | 75.2 | 80.4 | 86.2 | 91.0 |
| Vapor pressure (mmHg): (Found) | 16.7 | 22.4 | 25.1 | 29.6 | 34.0 | 43.4 | 57.4 | 70.7 |

Hydrogen is different from DMAH, and is gaseous at room temperature, and hence the $P_{H2}$ does not change exponentially. As a result, the molar mixing ratio diverges greatly depending on the temperature changes in the vicinity of the bomb.

Finally, disadvantage (3) is discussed below. The hydrogen partial pressure $P_{H2}$ at the bomb outlet is not the same as the hydrogen pressure at the inlet of the bomb, and they have the relationship:

$$P_{H2(out)} - P_{H2(in)} = c \cdot p \cdot h \quad (5)$$

wherein $P_{H2(out)}$ is a partial pressure of hydrogen at the bomb outlet;

$P_{H2(in)}$ is a partial pressure of hydrogen at the bomb inlet;

p is a specific gravity of the organic metal compound;

h is a distance between the opening of a bubbling nozzle and the surface of liquid in the bomb; and c is a pressure conversion factor.

In this case, the variable that can be controlled by a regulator is only the $P_{H2(in)}$. Since the value of h becomes smaller as the apparatus is used, the $P_{H2(out)}$ changes correspondingly. As a result, in order to keep the $P_{H2(out)}$ constant, the $P_{H2(in)}$ must be corrected in accordance with the quantity of the liquid remaining in the bomb. This, however, is accompanied with a great difficulty on account of the constitution of the apparatus.

As described above, the conventional apparatus has many problems in controlling a starting gas to optimum conditions.

The CVD process of the prior art making use of a liquid starting material also has the following problems.

When the organic metal compound is used as a starting material as previously stated, the organic metal compound gas is usually led into the reaction chamber by a method in which the organic metal compound that is liquid at room temperature is bubbled using a carrier gas so that a mixed gas of the carrier gas and the starting gas is fed into it.

Some organic metal compounds, however, have high viscosity in a liquid state, and hence usual bubbling may produce bubbles that become larger in size before they reach the surface of liquid. In such a case, the gas containing the starting material gas coming out of the surface of liquid undergoes pulsation to make it difficult to feed the material gas at a stable pressure.

Under such circumstances, even the flow rate of the gas fed into the reaction chamber may become unstable, and the deposition rate can not be stable. This causes the problem that the layer thickness can not be completely controlled or the film quality can not be stable.

In the case of the prior art as shown in FIG. 10, the partial pressure of the starting gas liquid 552 which is contained in the gas fed from the outlet pipe 556 can not be higher than the saturated vapor pressure of the starting gas liquid 552 at the temperature of a gas 554, and may change depending on the shape of the bubbling apparatus, the flow rate of the carrier gas 554, the temperature of the starting gas liquid 552, etc.

Hence, it has been difficult to keep constant the partial pressure ratio of the starting gas liquid 552 contained in a gas 557. In addition, in the case when the starting gas liquid 552 has a vapor pressure of several Torr or less, the ratio of partial pressure of the starting gas liquid 552 contained in the gas 557 to that of the carrier gas 554 comes to be 1:100 or less when bubbled under 1 atmospheric pressure.

In this case, the partial pressure of the starting gas liquid 552 inside the reaction chamber comes to be $10^{-2}$ Torr or less when the gas pressure inside the reaction chamber of the CVD apparatus into which the gas 557 is fed is set at 1 Torr, thereby making it difficult to feed the starting gas liquid to the wafer surface in a large quantity.

In the method of forming electrodes as described in prior art, there is a limit to the flatness of the surface and hence there is a limit to an improvement of yield in photolithography, often bringing about an obstacle to the formation into devices.

In the case when the polishing is employed, the polishing must be carried out at a high precision to hinder a cost decrease. Thus, an improvement has been sought.

Also when the semiconductor device array formed by SENTAXY is fabricated, it is indispensable to separate the devices, and a method that enables easy device separation is sought so long as the semiconductor device formed by SENTAXY is necessarily an aggregate of elements made up into a number of domains.

SUMMARY OF THE INVENTION

An object of the present invention is to provide a chemical vapor deposition apparatus, an apparatus capable of improving the controllability of the mixing ratio of the starting gas to the carrier gas, and obtaining a stable mixing ratio without regard to any changes in temperature in the vicinity of the bomb or any changes in quantity of the liquid remaining in the bomb.

Another object of the present invention is to provide a means for efficiently feeding a starting gas into a CVD reaction chamber and at a stable pressure even when a starting liquid having a relatively high viscosity is bubbled.

Still another object of the present invention is to provide, in a chemical vapor deposition apparatus, a means for feeding a starting gas liquid into a film forming chamber in a large quantity and a stable state even in the case of the starting gas liquid having a low saturated vapor pressure at room temperature in order to solve the problems of the prior art as described above.

A further object of the present invention is to provide a method for fabricating a semiconductor device with a high reliability at a low cost, which enables easy device separation of a semiconductor device array formed on the same substrate and can improve the yield of fabrication.
(Means to solve the problems and operation)

Means and operation A

According to the present invention, it is not necessary to carry out the bubbling of the starting gas liquid in the bomb which is a container holding it, but it is transported to another airtight container in which a liquid level is kept constant to carry out bubbling therein. The bubbling carried out therein makes it possible to decrease any ill influence of liquid level variations accompanied with gas consumption, in other words, to lessen variations in gas mixing ratio.

A course extending from the bubbling container to a reaction chamber is heated to increase the vapor pressure of the starting gas liquid. This makes it possible to feed the starting gas into the reaction chamber in a large quantity.

Means and operation B

According to the present invention, the organic metal compound with a low vapor pressure is not bubbled using a reaction gas (carrier gas), but instead bubbled using an inert gas by a similar mechanism. The flow rate of a mixed gas of the organic metal compound gas and the inert gas is measured and controlled, and the flow rate of the reaction gas (carrier gas) is measured and controlled through a different route. This makes it easier and more accurate to control the mixing ratio of the organic metal compound gas to the reaction gas (carrier gas).

Means and operation C

According to the present invention, the starting material with a high viscosity as exemplified by an organic metal compound is stirred using a magnetic stirrer or the like so to produce fine bubbles. This makes it possible to feed the reaction gas into a CVD reaction chamber without causing pulsation and at an elevated partial pressure of the starting gas.

Means and operation D

In the present invention, a reflux device is connected to the liquid starting material container that can be heated and also a carrier gas feed pipe comprised of a capillary tube is provided in the liquid starting material container. Then the liquid starting material is refluxed while the carrier gas is made to flow from the carrier gas feed pipe. At this time, the temperature of a refrigerant in the reflux device is controlled, whereby a gas mixture containing a starting gas liquid having a saturated vapor pressure at a specified temperature can be stably flowed out of the reflux device.

Means and operation E

The semiconductor device fabrication method of the present invention is characterized in that a monocrystalline region comprised of an electron-donative material is selectively grown at a given position on the surface of a substrate having a non-electron-donative and non-monocrystalline surface, and an Al electrode is selectively formed only on the surface of the monocrystalline region by low-pressure CVD using an alkylaluminum hydride diluted with $H_2$.

DESCRIPTION OF THE PREFERRED EMBODIMENTS

Preferred embodiments of the present invention will be described below.

FIGS. 11A to 11D illustrate an embodiment of a process for fabricating a semiconductor device according to the present invention.

Figure 11A:
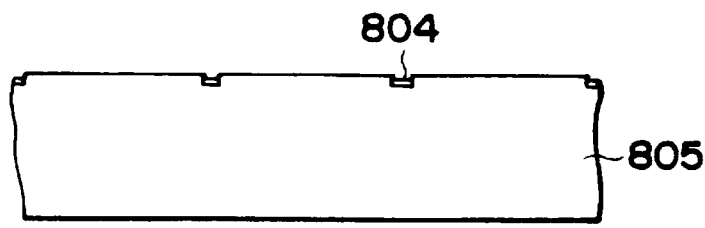
FIGS. 11A to 11D are cross-sections illustrating steps of an embodiment of the semiconductor device fabrication method of the present invention.

As shown in FIG. 11A, tungsten (W) is embedded by photolithography and sputtering in the vicinity of the surface of a substrate 805 whose surface is comprised of $SiO_2$, and $SiO_2$ is removed from only the part at which a semiconductor monocrystal is grown, so as for a W region 804 to be laid bare, which serves as a nucleation surface.

Figure 11B:
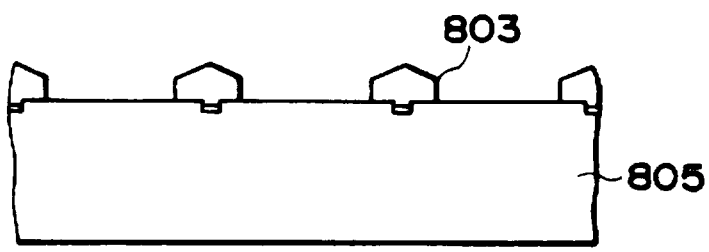

Next, as shown in FIG. 11B, a one conductivity type monocrystalline region 803 is grown from the nucleation surface of this minute W region 804 by the crystal growth process (SENTAXY) as disclosed, e.g., in Japanese Patent Application Laid-open No. 63-107016, in the presence of a one conductivity type doping gas.

Figure 11C:
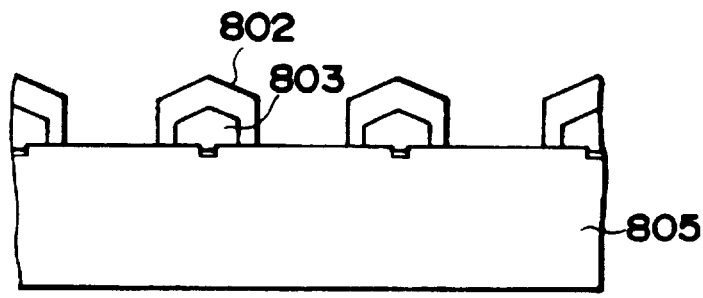

Next, as shown in FIG. 11C, a reverse conductivity type monocrystalline region 802 is grown in the presence of a reverse conductivity type doping gas to make up a pn junction in the monocrystal. The pn junction may also be formed by ion implantation carried out at the stage where the crystal growth has been completed. When the crystal growth is carried out in the absence of the doping gas to form an i-type monocrystal, the present invention is also applicable in instances in which a monocrystal is formed in combination of the conductivity type monocrystal with the i-type monocrystal. The crystal growth process is not limited to the SENTAXY and any process may be used so long as a monocrystal can be formed on a non-monocrystal.

According to the procedure as described above, devices or a device array can be formed on a substrate such as of $SiO_2$ or the like. The size of individual devices can be arbitrarily selected by controlling the distance between nucleation surfaces and the time for crystal growth. For example, it is easy to grow monocrystals of about 50 to several hundred μm at intervals of 0.1 to 1 mm.

When electrodes are formed on these individual devices or the device array, electrodes can not be formed by conventional semiconductor fabrication processes (comprising, e.g., a combination of the step of metal film formation by EB deposition or sputtering and the step of photolithography) since, as previously stated, the surface has irregularities because of the facets peculiar to monocrystals. The specific feature of the present invention resides in carrying out the formation of Al electrodes by low-pressure CVD using an alkylaluminum hydride diluted with $H_2$.

Figure 11D:
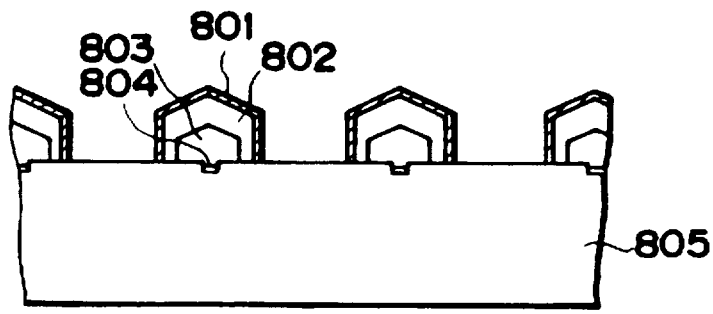

Use of such an electrode forming method makes it possible, as shown in FIG. 11D, to form an Al electrode 801 only on the monocrystal facets and to separate the individual device without electrode formation on the $SiO_2$ portion on the surface of the substrate 805.

The low-pressure CVD used in the present invention is carried out using alkylaluminum hydride diluted with $H_2$, at a pressure of about $10^{-3}$ to 760 Torr and at a substrate temperature of about 160 to 450° C. A specific method therefor is disclosed in Japanese Patent Application No. 2-6558. According to this method, Al can be deposited so long as the surface is made of an electron-donative material.

The electron-donative material herein refers to those in which free electrons are present in the substrate or free electrons are intentionally produced in it, as exemplified by a material having a surface capable of accelerating chemical reaction by electron transfer between the substrate surface and the starting material gas molecules having adhered to the surface. For example, metals and semiconductors are included in this material. It may also include metals or semiconductors on the surfaces of which thin oxide films are present. This is because the chemical reaction takes place by electron transfer between the substrate and the starting material molecules adhered thereto.

Specifically, such a material includes semiconductors such as monocrystalline silicon, polycrystalline silicon and amorphous silicon; two-component, three-component or four-component type Groups III–V compound semiconductors comprised of a combination of any of Group III elements Ga, In and Al and Group V elements P, As and N; and metals, alloys and silicides thereof such as tungsten, molybdenum, tantalum, tungsten silicide, titanium silicide, aluminum, aluminum-silicon, titanium-aluminum, titanium nitride, copper, aluminum-silicon-copper, aluminum-palladium, titanium, molybdenum silicide and tantalum silicide.

On the substrate thus constituted, Al can be deposited only by simple thermal reaction in a reaction system comprised of the starting material gas and $H_2$. For example, a thermal reaction taking place in a reaction system comprised of $(CH_3)_2AlH$ (DMAH) and $H_2$ is considered to basically proceed as follows:

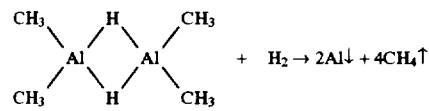

The DMAH assumes a dimer structure at room temperature.

Material not falling within this range, as exemplified by highly insulating materials such as $SiO_2$, $Si_3N_4$, SiC, BN, diamond, $Al_2O_3$ and $TaO_2$, can not be deposited by low-pressure CVD merely using the alkylaluminum hydride diluted with $H_2$. So long as the surface of a semiconductor integrated circuit or the like is covered with a layer comprised of such a non-electron-donative material, the deposition of Al can be prevented at that part. Hence, when the film formation of Al electrodes is carried out by this method, the Al electrodes can be formed only on the protruded surfaces of a plurality of devices without any patterning carried out by photolithography or the like and no electrodes adhere to the $SiO_2$ portion locating between the devices, thereby bringing about the advantage that the devices can be automatically or naturally separated.

As the alkylaluminum hydride, dimethylaluminum hydride DMAH, $(CH_3)_2$ AlH, or monomethylaluminum hydride MMAH, $CH_3AlH_2$, may be used.

The material for the substrate 805 is not limited to only $SiO_2$, and any materials may be used so long as they are non-electron-donative materials capable of controlling nucleation.

Example A1

Figure 1:
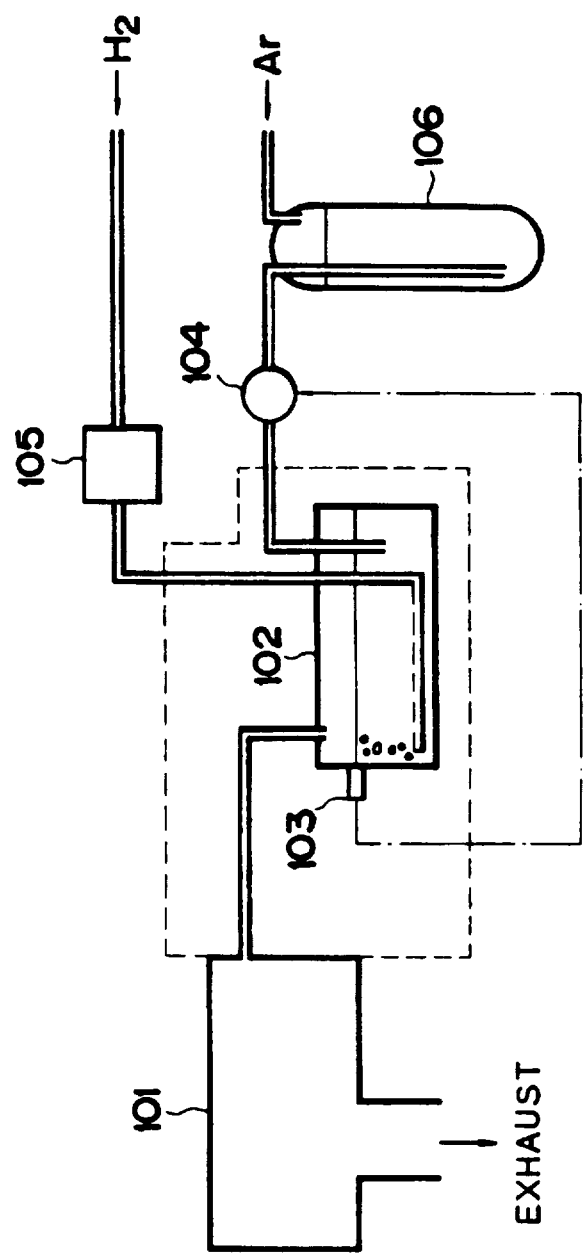
FIG. 1 schematically illustrates the construction of a chemical vapor deposition apparatus used in Example A1 of the present invention.

FIG. 1 is a diagrammatic view of the construction of a chemical vapor deposition apparatus that best represents the present invention.

In FIG. 1, reference numeral 101 denotes a reaction chamber; 102, an airtight container (starting gas-generating container) with a mechanism capable of keeping a liquid level constant and a mechanism for bubbling; 103, a liquid level sensor; 104, a valve; 105, a reducing valve that acts for reaction gas; 106, a bomb that holds a starting gas liquid.

An example in which DMAH is used as a starting gas will be described below in detail.

First, on the primary side of the bomb 106 having an opening above the surface of liquid, argon is pressure-fed into the bomb at a pressure higher than 1 atm (atmospheric pressure). This pressure of argon causes the DMAH to flow into the airtight container 102 through the valve 104.

In this airtight container 102, the liquid level sensor 103 is provided, which is of a non-contact and positive displacement type, so as to control the valve 104. More specifically, the valve 104 is kept open until the DMAH reaches to a given liquid level, and the valve 104 is kept close when the DMAH is judged by the sensor 103 to have reached a given liquid level. A chain line in FIG. 1 shows a signal system therefor. Because of the mechanism attached in this way, the DMAH liquid level in the container 102 can be always kept constant.

As a result, since the DMAH is bubbled in the container 102, no liquid level variations may occur even if the DMAH has been consumed in the reaction chamber, and the value of $P_{H2(out)} - P_{H2(in)}$ shown in formula (5) is kept constant. Therefore, it is unnecessary to correct $P_{H2(in)}$ in order to make $P_{H2(out)}$ constant.

The constitution as described above substantially solves the problem that is, the disadvantage (3), as described above.

Next, a course extending from the container 102 in which the liquid level is kept constant to the reaction chamber 101 is kept at a temperature of 80° C. The temperature can be kept by a method in which, not shown in the drawing, the container 102 is put in a thermostatic chamber and a heater is wound around the piping that connects the reaction chamber 101 and the container 102. In both instances, the temperature is controlled at 80° C. while it is measured by a thermocouple. The extent in which the temperature is controlled at 80° C. is the zone defined by a dotted line in FIG. 1.

Keeping the temperature at 80° C. is meaningful on two points. One is to accurately control temperature so as to decrease any variations in DMAH/hydrogen mixing ratio that may be caused by variations in temperature as previously discussed as disadvantage (2).

The other is to increase the vapor pressure of DMAH by setting the temperature at 80° C., which is higher than room temperature, to make it easy to control the DMAH/hydrogen mixing ratio. That is, the vapor pressure of DMAH at 80° C. is, as previously shown in Table 1, comes to be about 40 mmTorr. Hence, in order to set the DMAH/hydrogen mixing ratio to ½ to ⅕, the pressure may be controlled at 200 mmTorr to 320 mmTorr. This value is not so difficult for the reducing valve 105, and can be readily achieved (here, the bubbling differential pressure of hydrogen in the container 102 is set at 120 mmTorr). Control precision itself of the reducing valve 105 also becomes advantageous by 20 times compared with room temperature bubbling, thereby bringing about a great improvement in respect of the disadvantage (1) previously stated.

Increasing the vapor pressure of DMAH also makes it possible to feed DMAH gas in a large quantity, so that it is possible to control the rate of reaction in the reaction chamber 101 by the reaction itself.

In that instance, deposition is carried out under conditions of a substrate heating temperature of 270° C., a reaction chamber internal pressure of 1.2 Torr, a hydrogen primary pressure of 250 mmTorr and a heating temperature of 80° C. in the course extending from the container 102 to the reaction chamber 101. The mixing ratio can be more readily controlled if the heating temperature in the course extending from the container 102 to the reaction chamber 101 is further raised. However, in the case of DMAH, it is an unstable substance, which begins to thermally decompose at 130° C. or above, and hence the temperature was set at 80° C. from the viewpoint of safety.

Figure 6:
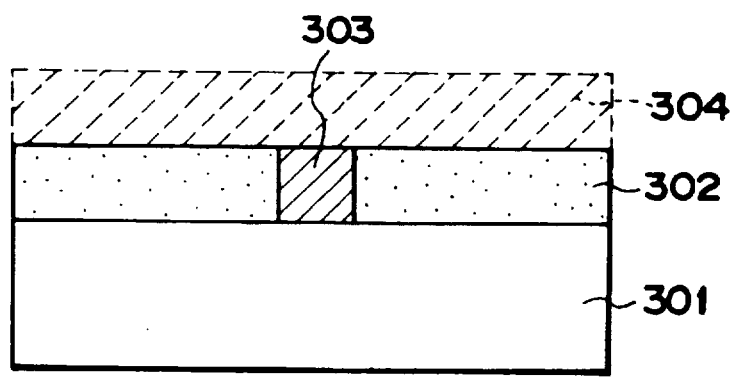
FIG. 6 is a diagrammatic cross section showing the deposition state of aluminum by ideal CVD.
Figure 7:
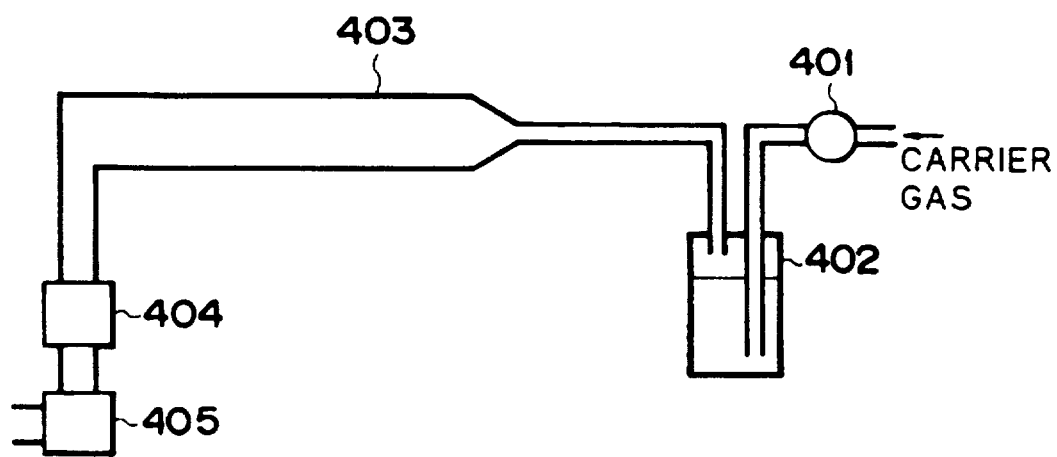
FIG. 7 diagrammatically illustrates the construction of a conventional chemical vapor deposition apparatus (CVD apparatus).
Figure 8:
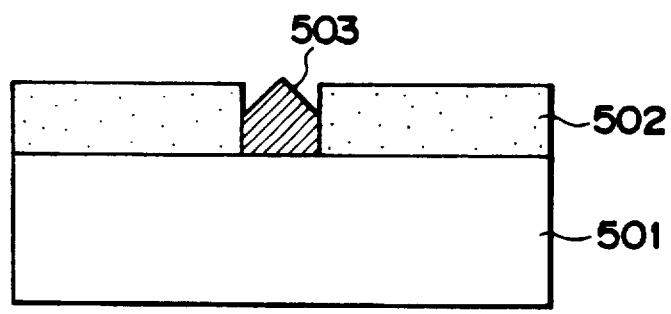
FIG. 8 is a diagrammatic cross section showing the deposition state of aluminum by CVD when hydrogen is in excess.

The constitution as described above made it possible to stably achieve the ideal filling-up with aluminum as shown by the aluminum 303 in FIG. 6.

The present invention can be applied to not only the instance where DMAH is used as the starting gas but also an instance where other organic aluminum compound such as triisobutylaluminum (TIBA) or the like is used.

The present invention can also be applied to not only the instance where the organic aluminum compound is used but also an instance where another CVD starting gas having a low vapor pressure at room temperature is used, which may include, for example, tetraethyl orthosilicate (TEOS).

The present invention can still also be applied to not only the instance where argon is used as the gas for pressure-feeding the liquid which becomes a starting gas but also where another inert gas such as helium, neon, nitrogen or the like is used.

In the present invention, in order to make the mixing ratio of the organic metal compound to the reaction gas such as more accurate, it is also effective to preheat the hydrogen or the like as a reaction gas between the reducing valve 105 and the container 102. This preheating carried out at the same temperature as the container 102 makes the partial pressure ratio more accurately controlled. In this case, the precision viewed from the degree of variation may act neither advantageously nor disadvantageously. Since, however, the partial pressure ratio of hydrogen to the organic metal compound directly corresponds to the molar ratio, no complicated calculation becomes necessary when deposition conditions are changed, thereby making it easy to carry out process control.

Example A2

Figure 2:
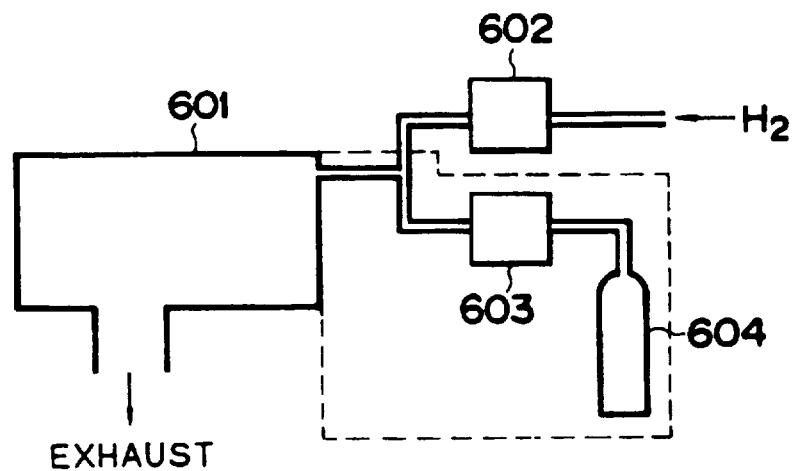
FIG. 2 schematically illustrates the construction of a chemical vapor deposition apparatus used in Example A2 of the present invention.

An apparatus in which the heating system as described above is simplified and also the mixing ratio of the starting gas to the reaction gas is controlled in accordance with flow rate ratio will be described with reference to the construction schematically illustrated in FIG. 2.

In the previous Example, the molar ratio of DMAH to hydrogen is controlled in accordance with partial pressure. In the method shown in FIG. 2, it is controlled in accordance with flow rate ratio.

In the present Example, a DMAH bomb 604 itself is heated to obtain vapor pressure of about 40 Torr.

No bubbling is carried out here, and the flow rate of only DMAH gas is controlled by a high-temperature micro-differential pressure mass flow controller 3. As this mass flow controller, SFC 670, manufactured by Hitachi Metals, Ltd., was used.

The reaction gas, hydrogen, was fed through another route so that its flow rate could be independently controlled by an ordinary mass flow controller 602.

Mixing the respective gases under control of their flow rates in this way makes it possible to feed a mixed gas into a reaction chamber 601 at any desired mixing ratio.

Example B1

Figure 3:
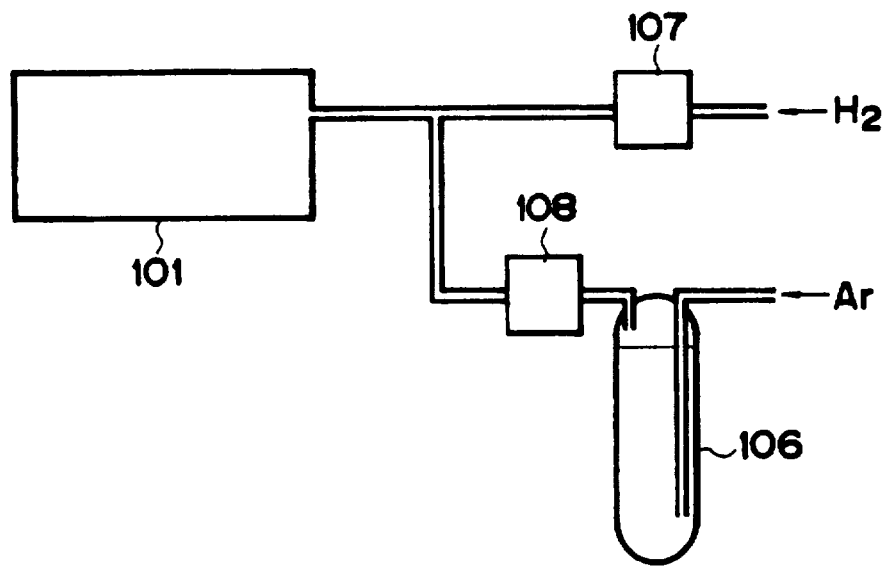
FIG. 3 schematically illustrates the construction of a chemical vapor deposition apparatus used in Example B1 of the present invention.

FIG. 3 schematically illustrates the construction of a chemical vapor deposition apparatus according to still another embodiment of the present invention. In FIG. 3, reference numeral 101 denotes a reaction chamber; 107, a mass flow controller capable of measuring the amount of reaction gas such as hydrogen to control its flow rate; 108, a mass flow controller capable of measuring the amount of a mixed gas of an inert gas such as argon and a saturated vapor of an organic metal compound to control its flow rate; and 106, a starting material bomb provided with a bubbling mechanism, holding an organic metal compound and used to generate therein a starting gas.

An example in which hydrogen is used as the reaction gas, an inert gas argon as the bubbling gas, and dimethylaluminum hydride (DMAH) as the starting gas liquid will be described below in detail with reference to the drawing.

In the present example, as shown in FIG. 3, the reaction gas and the liquid starting material (organic metal compound) are separately controlled, and hence the mixing molar ratio may be independently taken into account.

First, the reaction gas, hydrogen, can be directly controlled by the mass flow controller 107, and can be controlled to a precision of 2% or less in respect of hydrogen molar number $n_{H2}$ of the hydrogen fed into the reaction chamber 101 per hour.

Next, with regard to the organic metal compound DMAH, it can not be directly controlled by a mass flow controller because of its excessively low vapor pressure. However, the DMAH in the form of saturated vapor may be mixed with the inert gas argon, so that DMAH can be indirectly controlled by calculating the flow rate of argon.

Here, the vapor pressure of DMAH is a function of the temperature, and hence basically it must be corrected. Since, however, the place at which the deposition apparatus is installed is space where the temperature is precisely controlled, temperature correction is needed is very rare.

In addition, since the bubbling gas is not a reaction gas but an inert gas, it is unnecessary to strictly take into account the molar ratio of DMAH to argon. Hence, it is unnecessary to particularly decrease the bubbling primary pressure of argon gas, and a pressure of about 1 atm. may be applied. As a result, a mass flow controller can be placed on the secondary side of the bomb, and the flow rate of argon gas at least can be controlled.

More specifically, the DMAH has a vapor pressure of 1 Torr to 2 Torr at room temperature, and has a partial pressure lower by two to three figures than that of argon. Hence, the gas flow rate in the mass flow controller can be considered to be in substantially the same state as in an instance where argon is fed alone. As a result, the argon-DMAH mixed gas flow rate can be controlled to a precision of about 2% as a total flow rate.

As is seen from the foregoing description, the precision in the control of the mixing ratio of DMAH to hydrogen depends on the precision in the control of the mixing ratio of argon to DMAH. Here, the mixing ratio of argon to DMAH is governed by the primary pressure of argon to the bomb and the vapor pressure of DMAH. Thus, the pressure ratio substantially depends on the precision of a regulator at the side of argon and the precision of temperature control at the side of DMAH. Stated exactly, the partial pressure of argon does not correspond to the primary pressure of the bomb, and, as previously shown in formula (5), the differential pressure ascribable to a residual liquid of DMAH must be taken into account. However, since this case is different from the case when the bubbling is carried out using hydrogen, the primary pressure can be set at a larger value of about 1 atm., and hence the primary pressure can be approximately replaced with the secondary side argon partial pressure. As a result, when the apparatus is used in space provided with an air conditioner capable of controlling temperature variations within about 2° C., the mixing ratio of argon to DMAH can be controlled to a precision of about 15% or less even when any changes of the residual liquid in the bomb are taken into account. In other words, it follows that the mixing ratio of hydrogen to DMAH can be controlled to a precision of 20% or less.

As previously discussed, the prior art employing the bubbling with hydrogen involved in the three disadvantages. With regard to the disadvantage (1), the present invention is considered to be effective to solve the problem of controlling the mixing ratio of hydrogen to the organic metal compound. That is, in the prior art, the hydrogen/DMAH mixing ratio deviated by 100% or more from a prescribed value. On the other hand, in the present invention, it can be controlled at least to a precision of 20% or less.

With regard to the disadvantage (2), i.e., changes in mixing ratio in accordance with temperature changes, both the prior art and the present invention are on the same level. Since, however, this problem can be avoided if the apparatus is used in a room provided with an air conditioner, this can not be a major disadvantage of the present invention.

With regard to the disadvantage (3), i.e., an influence of the quantity of a liquid remaining in the bomb on the mixing ratio, since higher pressure by one or more figures is applied to the primary pressure of the bomb, the degree of variation can be made smaller by one figure or more compared with the prior art employing the bubbling with hydrogen. In theory, the pressure difference of formula (5) can not be zero. However, its influence can be made smaller.

In the above, an example of the present invention is described with reference to an instance where DMAH is used as the organic metal compound and hydrogen is used as the reaction gas. Compared with the prior art employing the bubbling with hydrogen, the present invention can bring about a great improvement even though the disadvantages can not be completely eliminated.

The present invention can be applied to not only the instance where DMAH is used as the organic metal compound gas but also an instance where triisobutylaluminum (TIBA) is used.

The present invention can also be applied to not only the instance where the organic aluminum compound is used but also an instance where other CVD starting material gas having a low vapor pressure at room temperature is used, which may include, for example, trimethyl gallium, TMG.

The present invention can still also be applied to not only the instance where argon is used as the inert gas but also an instance where other inert gases such as nitrogen, helium or neon are used.

The present invention can still also be applied to not only the instance where the apparatus is used under room temperature bubbling but also an instance where the apparatus is used in a system in which a course extending from the bomb 106 through the mass flow controller 108 to the reaction chamber 101 is heated to from 60° C. to 80° C. The bubbling with heating makes it possible to increase the saturated vapor pressure of DMAH by 40 times that in the case of room temperature bubbling, and also makes it possible to determine the reaction rate of thermal decomposition in the reaction chamber 101 not by the rate of feeding but by the reaction itself. In this case, the aluminum can be deposited in the state of the aluminum 303 shown in FIG. 6, thereby obtaining a flat embedment.

Here, deposition is carried out under conditions of a silicon substrate heating temperature of 270° C., a reaction chamber internal pressure of 1.2 Torr, a hydrogen flow rate of 100 sccm and an argon-DMAH mixed gas flow rate of 500 sccm.

Example C1

Figure 4:
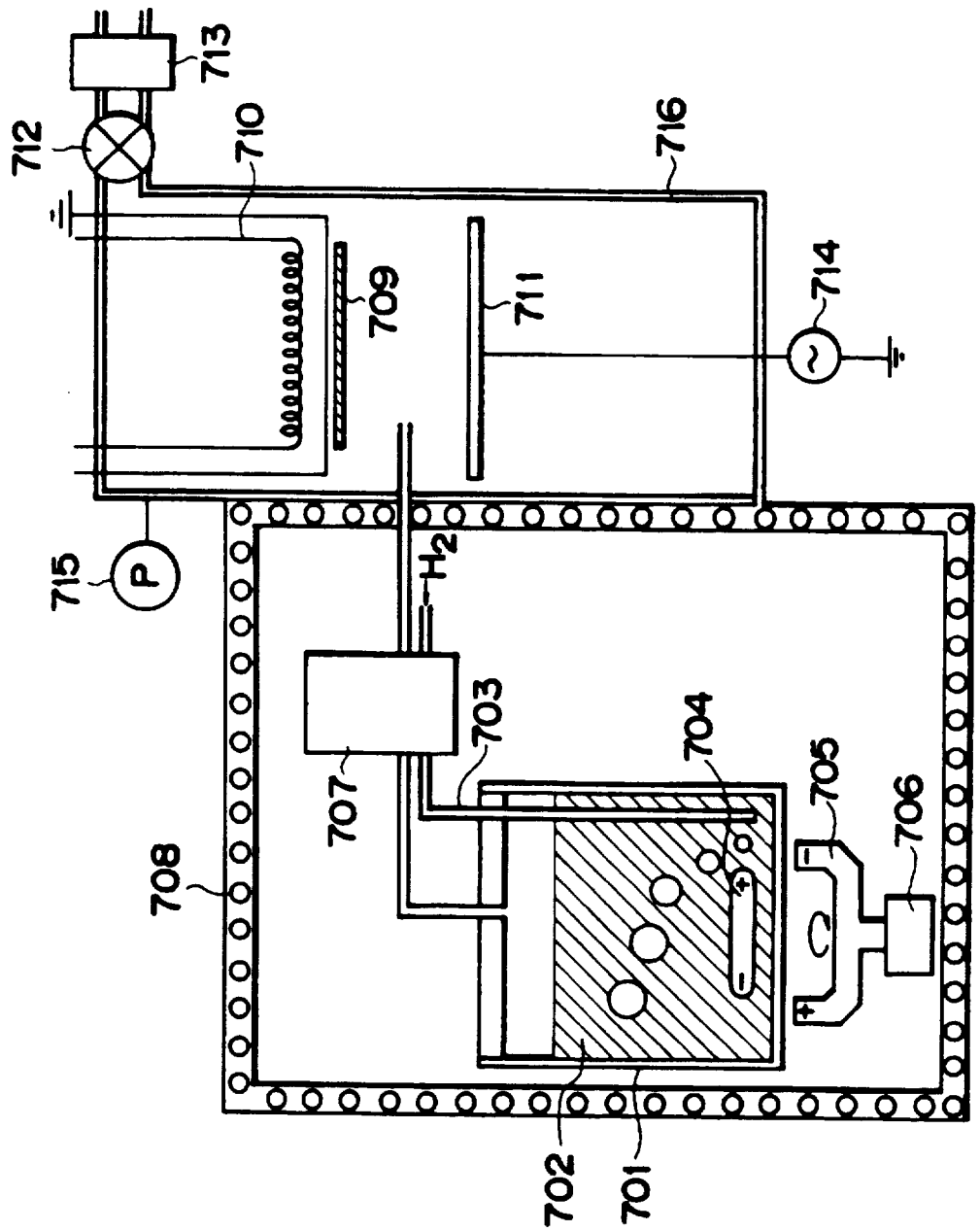
FIG. 4 schematically illustrates the construction of a chemical vapor deposition apparatus used in Example C1 of the present invention.
Figure 5A:
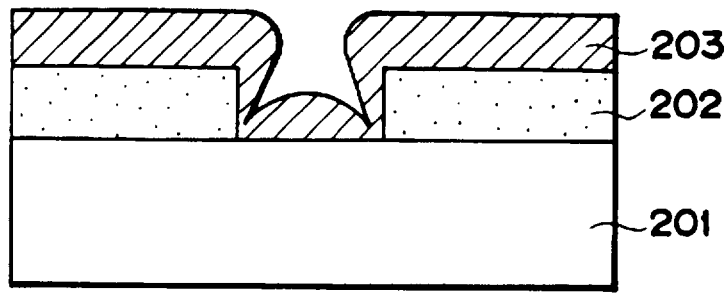
FIGS. 5A and 5B are diagrammatic cross sections showing the deposition state of aluminum by conventional sputtering.
Figure 5B:
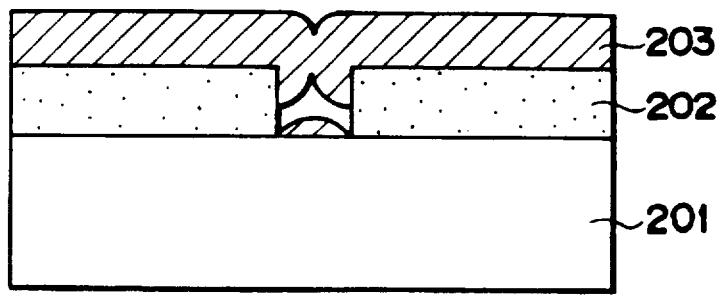

FIG. 4 schematically illustrates the construction of a chemical vapor deposition apparatus according to a further embodiment of the present invention. In FIG. 4, reference numeral 701 denotes a container whose inner walls are made of an insulating material; 702, a starting gas liquid with a high viscosity as exemplified by DMAH; 703, a tube with a minute opening at its tip from which a carrier gas (reaction gas) such as $H_2$ gas is fed into the container; 704, a magnetic member such as a magnetic stirrer, i.e., a device for stirring the liquid starting material having a high viscosity; 705 and 706, a magnet and a motor, respectively, that rotatingly drive the stirrer; 707, a mass flow controller; 708, a thermostatic chamber having a heating mechanism; 709, a semiconductor substrate such as a silicon wafer; 710, a heater for heating the semiconductor substrate; 711, a substrate-opposing electrode used for excitation of plasma; 712, a pressure control valve; 713, a vacuum pump such as a rotary pump with a mechanical booster pump; 714, a high-frequency power source; and 715, a pressure gauge. Reference numeral 716 denotes a reaction chamber.

An example of the present invention will be described below with reference to the drawing. When DMAH is used as the starting gas liquid 702, because of its relatively high viscosity, the carrier gas hydrogen mixed into it from the tube 703 may necessarily make bubbles that become larger in diameter before they reach the surface of liquid over a long time, to have a smaller interfacial surface energy, whatever minute outlet opening the tube 703 may have.

As previously stated, this may cause the pulsation that is accompanied with great variations in the pressure of the starting gas fed into the mass flow controller 707.

Accordingly, in the present Example, 705 and the motor 706 are driven to rotate the stirrer 704 so that the liquid DMAH may swirl (that is, energy is externally applied). This can make bubbles smaller in diameter and can bring about a condition in which the pulsation is less likely to occur.

Since the bubbles pass through the starting material while being kept small, the starting material simultaneously brings into contact with the carrier gas on a large surface area, so that the starting gas can be fed into the reaction chamber 716 in a good efficiency through the mass flow controller 707.

The starting gas-feeding system having therein the components including the liquid starting material container 701 up to the mass flow controller 707 is enclosed in the thermostatic chamber 708. The starting material gas having passed through the mass flow controller 707, whose DMAH/ $H_2$ partial pressure ratio is 1/10 to 1/100, is led into the reaction chamber 716. Here, the temperature of the thermostatic chamber 708 is kept constant at 80° C. or below so that the stability of DMAH can be ensured.

The starting gas thus fed into the reaction chamber 716 in a proper mixing ratio and a stable state reaches the semiconductor substrate 709 heated by means of the heater 710, and undergoes thermal decomposition thereon, so that the intended reaction product is deposited on the semiconductor substrate.

This reaction is chiefly the reaction of formula (1) previously set out, and has a sufficient selectivity between a conductor and a non-conductor, so that the state of filling-up as shown in FIG. 6 can be produced.

The high-frequency power source 714 may also be actuated for excitation to generate plasma across the semiconductor substrate 709 and the electrode 711, whereby non-selective growth can be carried out. Hence, the deposited film as shown in FIG. 6 by reference numeral 304 can also be formed using the same apparatus.

As typical conditions, the deposition is carried out at a hydrogen-DMAH mixed gas flow rate of 550 sccm, a DMAH/$H_2$ partial pressure ratio of 1/10, a reaction chamber internal pressure of 1.2 Torr and a silicon substrate heating temperature of 270° C.

The deposition carried out under such conditions made it possible to form an aluminum thin film with superior flatness and film quality.

The liquid starting material-feeding system and thin film deposition system in the CVD according to the present invention as shown in FIG. 4 can be applied to all CVD apparatus making use of liquid starting materials.

Besides the DMAH, an organic aluminum compound such as trimethylaluminum or triisobutylaluminum hydride may also be used as the liquid starting material.

The present invention can be applied to not only the instance where the organic aluminum compound is used but also an instance where other CVD starting material gases having a low vapor pressure at room temperature are used, which may include, for example, tetraethyl orthosilicate (TEOS).

The present invention can also be applied to not only the apparatus having the reaction chamber of a sheet-by-sheet processing type as shown in FIG. 4 but also a CVD apparatus having a reaction chamber capable of multi-sheet processing of a hot wall type.

Example D1

A still further embodiment of the present invention will be described below in detail with reference to the drawing.

Figure 9:
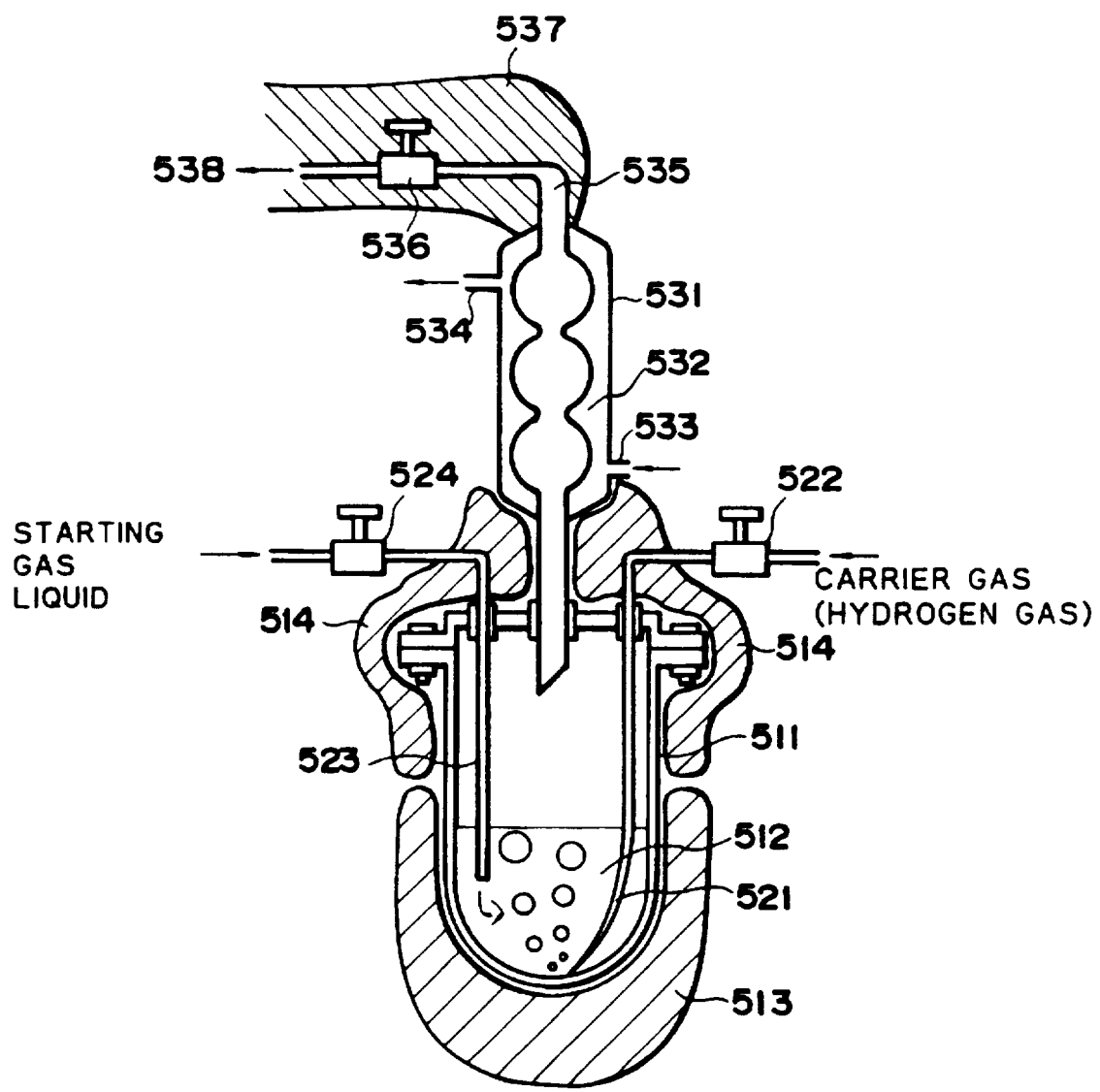
FIG. 9 is a diagrammatic cross section of a liquid starting material vaporizing apparatus used in Example D1 of the present invention.
Figure 10:
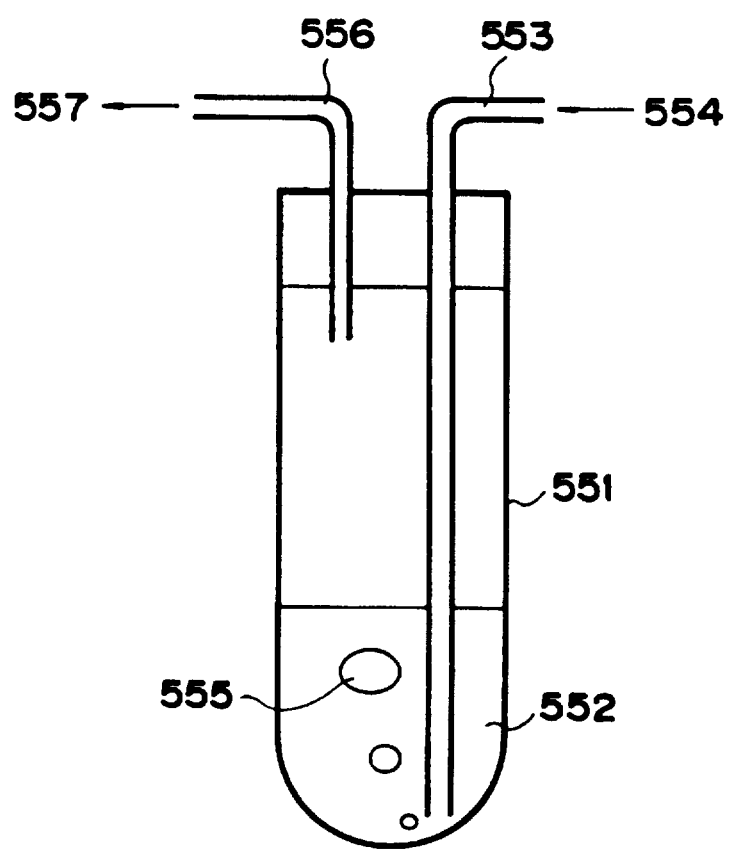
FIG. 10 is a diagrammatic cross section of a conventional liquid starting material vaporizing apparatus.

FIG. 9 schematically illustrates the construction of a liquid starting material-vaporizing apparatus which represents a specific feature of the present invention. In the drawing, reference numeral 511 denotes a starting gas liquid container; 512, a starting gas liquid; 513 and 514, heaters for heating the starting gas liquid container 511; 521, a gas feed pipe from which a carrier gas is fed into the starting gas liquid container 511 and whose tip is formed of a capillary tube; 522, a carrier gas feed valve; 523, a starting gas liquid-feeding pipe from which the liquid material gas is fed into the starting gas liquid container 511; and 524, a starting gas liquid-feeding valve. Reference numeral 531 denotes a reflux condenser connected to the starting gas liquid container 511; 532, a refrigerant; 533, a refrigerant inlet; 534, a refrigerant outlet; 536, a discharge valve for discharging a mixed gas of the carrier gas and the starting gas liquid; and 537, a heater for heating gas piping in its course extending from a mixed gas discharge portion 535 of the reflux condenser 531 to the use point of the mixed gas. Reference numeral 538 denotes a mixed gas of the carrier gas and the starting gas liquid, which flows out of the reflux condenser 531.

First, the refrigerant temperature-conditioned to the intended temperature is led from the refrigerant inlet 533 into the reflux condenser 531, and the reflux condenser 531 is kept at a prescribed temperature. Subsequently, the starting gas liquid 512 is led from the starting gas liquid-feeding pipe 523 into the starting gas liquid container 511, and the the starting gas liquid container 511 is heated at its bottom by means of the heater 513, to a temperature higher than the boiling point of the starting gas liquid 512 held under the pressure kept in the starting gas liquid container 511.

At that time, the carrier gas is flowed from the gas feed pipe 521 at the intended flow rate. Here, the tip of the gas feed pipe 521 is formed of a capillary tube, and is so provided as to come into contact with the bottom of the starting gas liquid container 511. The temperature of the heaters 514 and 537 is set at a temperature higher than the temperature of the refrigerant 532 led into the reflux condenser 531.

In the condition set as described above, the starting gas liquid 512 is kept smoothly boiled. The vapor of the starting gas liquid flowed into the reflux condenser 531 is cooled by the refrigerant 532 and refluxed into the starting gas liquid container 511. At this time, the carrier gas containing the vapor of the starting gas liquid with a saturated vapor pressure corresponding to that of the starting gas liquid 512 held at the temperature of the refrigerant 532 and under the pressure inside the mixed gas discharge portion 535 is flowed out through the mixed gas discharge portion 535. The flow rate and composition of the mixed gas 538 thus flowed out can be maintained at constant values so long as the carrier gas is fed from the gas feed pipe 521 at a constant flow rate and the starting gas liquid 512 is smoothly refluxed.

An example in which a liquid starting gas is actually fed will be described below while showing temperature and pressure at each component part in the case when DMAH is used as the starting gas liquid.

DMAH has a boiling point of 154° C. at 1 atm. At this temperature, DMAH may gradually decompose. Hence, the reflux must be carried out at about 80° C. or below at which the DMAH can be stable.

More specifically, when DMAH is used, the inside of the starting gas liquid container 511 and the inside of the reflux condenser 531 are evacuated to 40 mmHg. Then, the refrigerant 532, comprising FLORINATE FX330 (available from 3M Co., U.S.A), temperature-conditioned at 65° C. is led into the reflux condenser 531, and the heater 513 is set at about 90° C. and the heaters 514 and 537 at 70° C. each.

Subsequently, hydrogen gas of 100 sccm is fed as the carrier gas from the gas feed pipe 521. In this condition, the DMAH is boiled at about 80° C. and smoothly refluxed. The composition of the mixed gas 538 was examined to find that a mixed gas of 200 sccm, comprised of 50% of the carrier gas hydrogen and 50% of DMAH, was obtained. To the mixed gas of 200 sccm, containing hydrogen and DMAH in a 1:1 partial pressure ratio, hydrogen is added at 800 sccm, and the resulting mixed gas was fed into the CVD apparatus.

In the present Example, portions coming into contact with DMAH, including inner walls of the starting gas liquid container 511 and the gas feed pipe 521, starting gas liquid-feeding pipe 523 and inner walls of reflux condenser 531, are made of an insulating material such as quartz or Teflon.

Example E1

A still further embodiment of the present invention will be described below with reference to FIGS. 11A to 11D.

A pn diode array for use in an image sensor can be formed on a transparent fused quartz substrate.

First, on a fused quartz substrate 805, W (tungsten) is formed into a film by sputtering, which is then subjected to patterning by photolithography to form stripes of W electrodes of 50 μm wide in a pitch of 500 μm.

Next, on this substrate, an $SiO_2$ layer of about 3,000 Å thick is formed by thermal CVD so as to cover the W electrodes, further followed by photolithography to partially remove $SiO_2$ present on the W electrodes to make windows of 2 μm square in the $Sio_2$ layer formed on the stripes of W electrodes. Thus, regions 804 in which W has been laid bare in a size of 2 μm are arranged at a pitch of 500 μm.

Next, this substrate is put in a thermal CVD reactor to make Si crystals grow from the surfaces of the 2 μm square W electrodes as the nucleation surface. The crystal growth is carried out at a substrate temperature of 920° C. and a pressure of 160 Torr, using as the starting gas a mixed gas of $SiH_2Cl_2$, HCl and $H_2$ which are fed at flow rates of 0.4, 1.7 and 120 liter/minute, respectively. Thus, monocrystals of Si are grown only on the W electrodes. At this time, film formation is halfway carried out while mixing $PH_3$ in the gas and, after the mixing of $PH_3$ is stopped, film formation is further carried out while mixing $B_2H_6$, so that n-type Si monocrystals 803 are formed on the W electrodes and p-type Si monocrystals 802 are formed thereon.

The growth of the n-type Si is carried out for 30 minutes and thereafter the growth of the p-type Si is carried out for 25 minutes, so that an array of Si monocrystals with pn junctions, of about 300 μm in size, can be made up on the W electrodes at a pitch of 500 μm. The respective surfaces of the crystals are all formed of p-type Si, and no n-type Si is laid bare to the surface. The respective crystals are also separated with $SiO_2$ of the substrate.

Next, this substrate with the Si monocrystals is moved to another CVD apparatus, and Al is deposited at a substrate temperature of 250° C. As a starting gas, DMAH diluted with $H_2$ is used, and the deposition is carried out at a total pressure of 1.5 Torr and a DMAH partial pressure of about $2 \times 10^{-4}$ Torr. Thus, Al electrodes 801 are formed only on the Si monocrystal regions and no Al is deposited on the surface of $SiO_2$, so that Al deposition and device separation can be completed at the same time.

Contacts are attached to the respective Al electrodes by wire bonding to connect them to external circuits. Thus, a pn diode array can be formed on the transparent substrate.

These devices are well separated from each other, and hence can be driven in an electrically independent form. The device thus fabricated can be used as an image sensor.

Example E2

In place of W, $Si_3N_4$ is used as the material for the nucleation surfaces. The nucleation surfaces are arranged at a pitch of 10 μm in a size of 1 μm. $Si_3N_4$ is formed into a film by LPCVD, a well known process.

On the substrate, Si monocrystals are made to grow in substantially the same manner as in Example E1. The crystal growth is carried out at a substrate temperature of 950° C. for 16 minutes at a pressure of 160 Torr, while feeding $SiH_2Cl_2$, HCl and $H_2$ at flow rates of 0.53, 1.8 and 100 liter/minute, respectively. Thus, Si monocrystals of about 5 μm in size are formed on the $Si_3N_4$ nucleation surfaces.

Next, this substrate with the Si monocrystals is moved to another CVD apparatus, and Al is deposited in the same manner as in Example E1, i.e., at a substrate temperature of 250° C., a DMAH/$H_2$ total pressure of 1.5 Torr and a DMAH partial pressure of about $2 \times 10^{-4}$ Torr. Thus, Al can be deposited only on the crystal surfaces of about 5 μm size arranged on $SiO_2$ at intervals of 10 μm.

ADVANTAGE A

As described above, the bubbling is carried out not in the starting material bomb but in another container in which a liquid level is kept constant, and the course extending from the container to the reaction chamber is heated to a temperature higher than room temperature and lower than the thermal decomposition temperature of the starting gas liquid. This brings about the following advantages:

(i) The molar mixing ratio of the starting gas with a low vapor pressure at room temperature to the reaction gas can be controlled at a precision improved by one figure or more compared with the room temperature bubbling;

(ii) no variations in mixing ratio may be caused by temperature changes in the vicinity of the apparatus; and (iii) no variation in mixing ratio may also be caused by a drop of liquid level in the bomb during the feeding of gas, so that the gas phase chemical reaction can be stably carried out.

ADVANTAGE B

As also described above, when the bubbling is carried out using not the reaction gas but the inert gas, the flow rate of the reaction gas and that of the organic metal compound can be independently controlled. This brings about the advantage that the mixing ratio of the organic metal compound gas and the reaction gas can be more accurately controlled.

ADVANTAGE C

As still also described above, in the feeding of the liquid starting material into the CVD apparatus, by the starting material in the bubbling container is stirred, it is possible to feed the starting gas into the reaction chamber in a good efficiency without causing the pulsation.

This has made it possible to obtain a deposited reaction product with a good film quality and in a good state of deposition.

ADVANTAGE D

As still also described above, according to the present invention by providing, a starting gas reflux condenser, it is possible to feed the starting gas liquid in a large quantity and at a high partial pressure ratio even when the liquid starting material has a low vapor pressure at room temperature.

ADVANTAGE E

As still also described above, according to the present invention, Al can be readily deposited only on the surface of a monocrystal region comprised of an electron donative material, which is formed on the substrate having a non-electron-donative and non-monocrystalline surface.

What is claimed is:

1. A unit for vaporizing a liquid starting material into a vaporized starting material and supplying the vaporized starting material to a chemical vapor deposition apparatus, the unit comprising:

a container for storing a liquid starting material provided with a first heater;

a capillary tube having a tip, said tip being positioned so that it is in contact with the bottom of the container to supply a bubbling gas into the container;

a condenser for cooling the vaporized starting material provided downstream of the container; and a second heater for heating the vaporized starting material provided downstream of the condenser, wherein the first heater heats the liquid starting material to a temperature equal to or greater than the boiling point of the starting material, and the second heater maintains a temperature below the temperature provided by the first heater.

2. A chemical vapor deposition apparatus provided with a unit for vaporizing a liquid starting material into a vaporized starting material, the unit comprising:

a container for storing a liquid starting material provided with a first heater;

a capillary tube having a tip, said tip being positioned so that it is in contact with the bottom of the container to supply a bubbling gas into the container;

a condenser for cooling a vaporized starting material provided downstream of the container; and a second heater for heating the vaporized starting material provided downstream of the condenser, wherein the first heater heats the liquid starting material to a temperature equal to or greater than the boiling point of the starting material, and the second heater maintains a temperature below the temperature provided by the first heater.

3. A chemical vapor deposition apparatus comprising:

(a) a container to contain a liquid starting material;

(b) first heating means adapted to heat the liquid starting material to a temperature equal to or greater than its boiling point at operating pressure within said container;

(c) gas feed means to introduce a carrier gas into said container at a constant flow rate, wherein said gas feed means comprises an injection capillary tube having a tip, said tip being positioned to be in contact with the bottom of said container in order to bubble the carrier gas into the liquid starting material;

(d) a reflux condenser connected to said container to cool a starting gas produced by vaporizing the liquid starting material; and (e) means to maintain the operating temperature of said reflux condenser wherein the cooled starting gas is a saturated vapor and condensed liquid is returned to said container.

4. The apparatus according to claim 3, wherein said (a) to (e) elements of the apparatus coming into contact with the liquid starting material or the starting gas are composed of an insulating material.

5. The apparatus according to claim 3, including a second heating means, said second heating means comprising a heater arranged downstream of said reflux condenser to heat the cooled starting gas at a temperature higher than the operating temperature of said reflux condenser.

6. The apparatus according to claim 5, wherein said (a) to (e) elements of the apparatus coming into contact with the liquid starting material or the starting gas are composed of an insulating material.

7. the apparatus according to any one of claims 3, 4, 5, or 6, further comprising means for maintaining a reduced operating pressure within said container and said reflux condenser.

* * * * *